United States Patent [19]
Yamazaki

[11] Patent Number: 6,118,148
[45] Date of Patent: Sep. 12, 2000

[54] SEMICONDUCTOR DEVICE AND MANUFACTURING METHOD THEREOF

[75] Inventor: Shunpei Yamazaki, Tokyo, Japan

[73] Assignee: Semiconductor Energy Laboratory Co., Ltd., Kanagawa-ken, Japan

[21] Appl. No.: 08/963,977

[22] Filed: Nov. 4, 1997

[30] Foreign Application Priority Data

Nov. 4, 1996 [JP] Japan ................................. 8-308685
Nov. 4, 1996 [JP] Japan ................................. 8-308686

[51] Int. Cl.⁷ ............................................. H01L 21/8228
[52] U.S. Cl. ................................... 257/327; 257/369
[58] Field of Search ................................ 438/163, 269, 438/278, 448, 9, 199, 204, 212, 217, 301, 407, 479, 450, 528, 420; 257/351, 274, 369, 371, 327

[56] References Cited

U.S. PATENT DOCUMENTS

| | | | |
|---|---|---|---|
| 4,959,697 | 9/1990 | Shier et al. | 257/279 |
| 4,999,682 | 3/1991 | Xu et al. | 257/13 |
| 5,196,367 | 3/1993 | Lu et al. | 438/448 |
| 5,532,175 | 7/1996 | Rancanelli et al. | 438/163 |
| 5,661,059 | 8/1997 | Liu et al. | 438/276 |
| 5,670,389 | 9/1997 | Huang et al. | 438/163 |
| 5,674,788 | 10/1997 | Wristers et al. | 438/269 |
| 5,894,137 | 4/1999 | Yamazaki et al. | 257/66 |

FOREIGN PATENT DOCUMENTS

| | | |
|---|---|---|
| 4-206971 | 7/1992 | Japan . |
| 4-286339 | 10/1992 | Japan . |
| 6-244103 | 9/1994 | Japan . |
| 7-135318 | 5/1995 | Japan . |
| 7-321339 | 12/1995 | Japan . |
| WO 88/03328 A1 | 5/1988 | WIPO . |

*Primary Examiner*—Brian Dutton
*Assistant Examiner*—William David Coleman
*Attorney, Agent, or Firm*—Fish & Richardson P.C.

[57] ABSTRACT

In a CMOS circuit, impurity regions are formed in the channel forming region of each of an n-channel and p-channel transistors along the channel direction. The intervals between the impurity regions in the n-channel transistor is set narrower than those between the impurity regions in the p-channel transistor so as to make the absolute values of the threshold voltages of the n-channel and p-channel transistors approximately equal to each other. Where active layers are formed by utilizing a crystal structural body that is a collection of needle-like or columnar crystals, the same effect can be attained by controlling the width of the needle-like or columnar crystals.

77 Claims, 10 Drawing Sheets

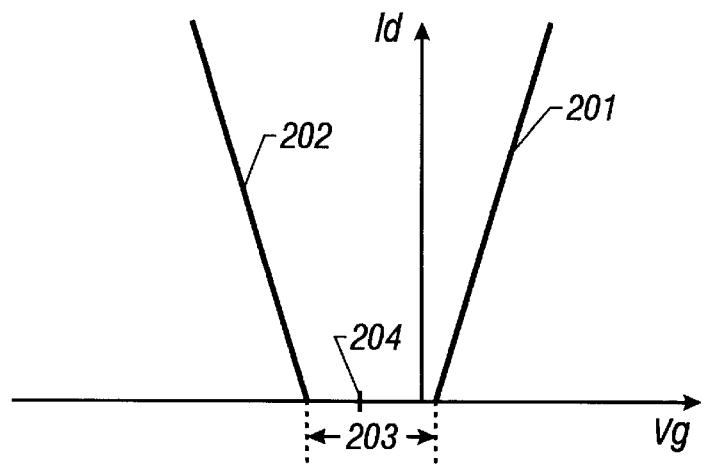
FIG. 2
*(Prior Art)*
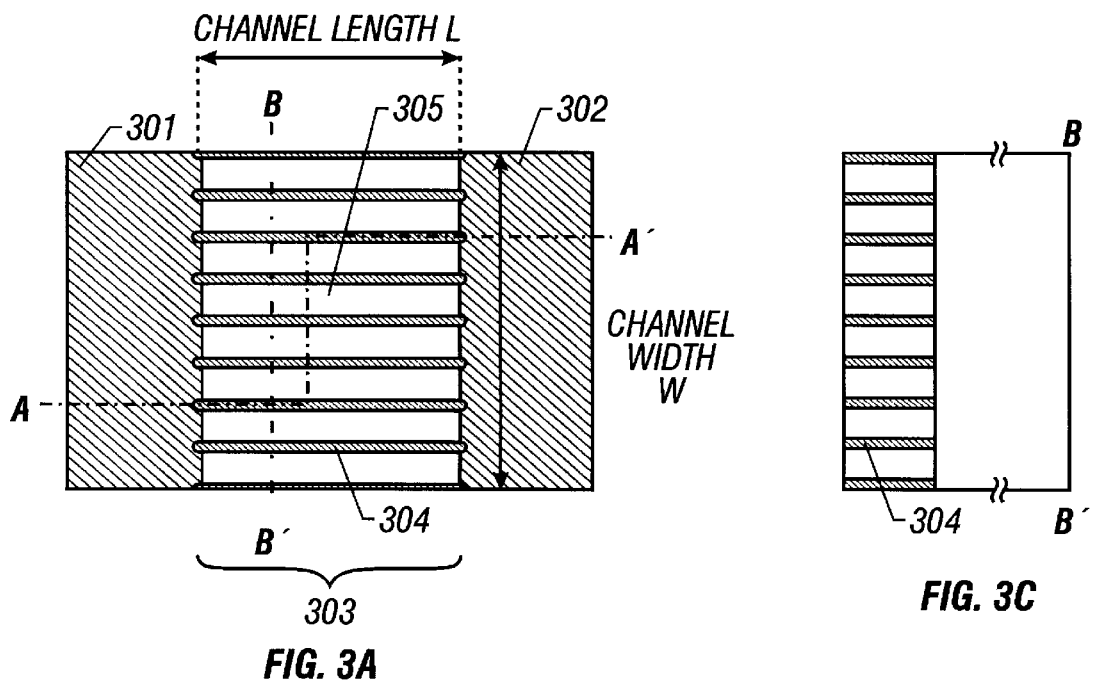
FIG. 3A
FIG. 3C
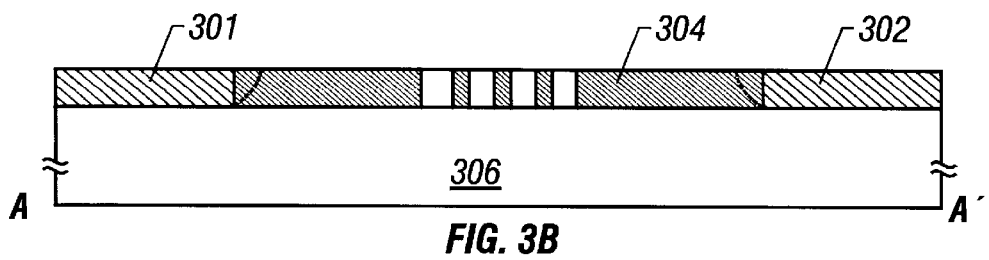
FIG. 3B

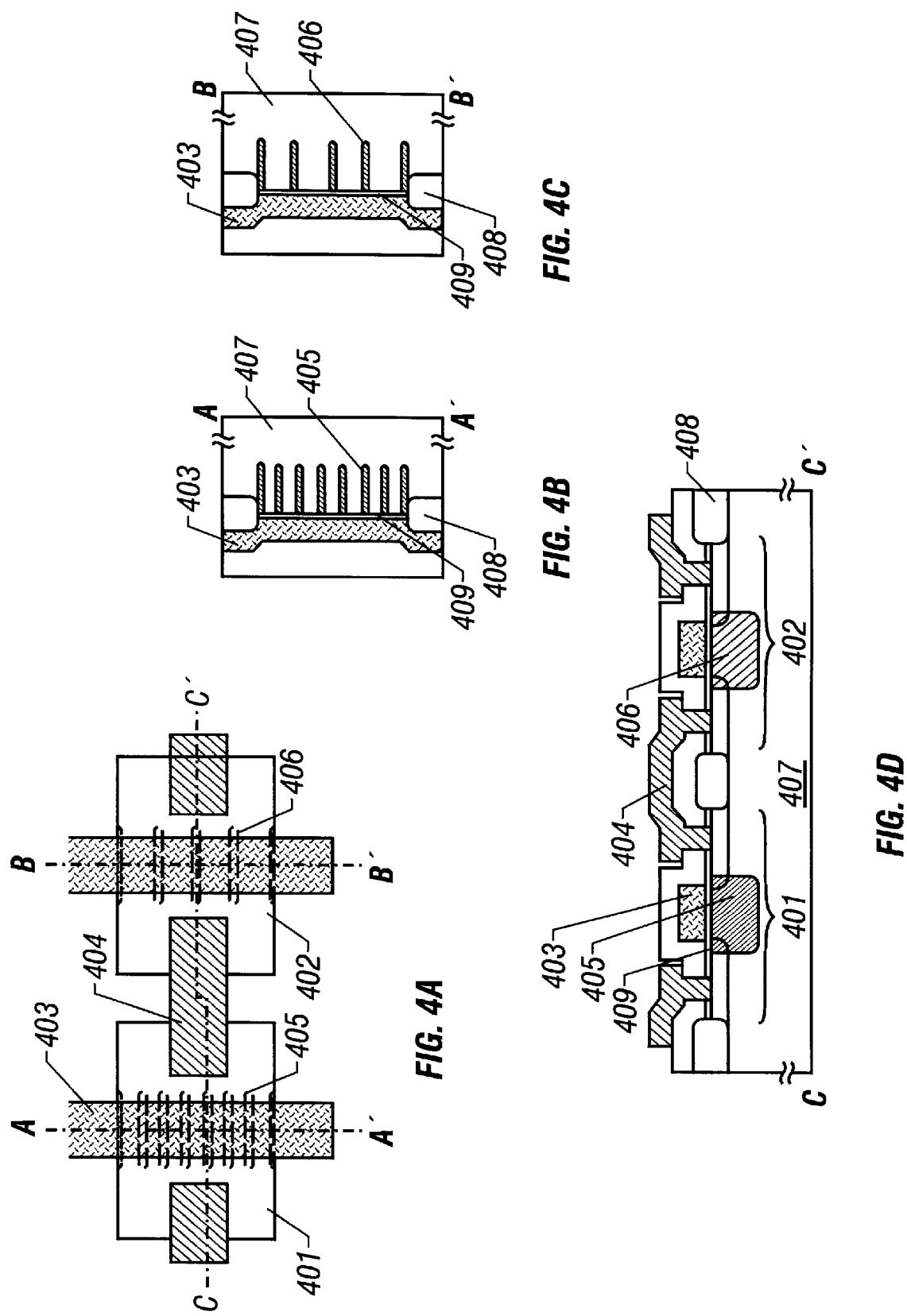

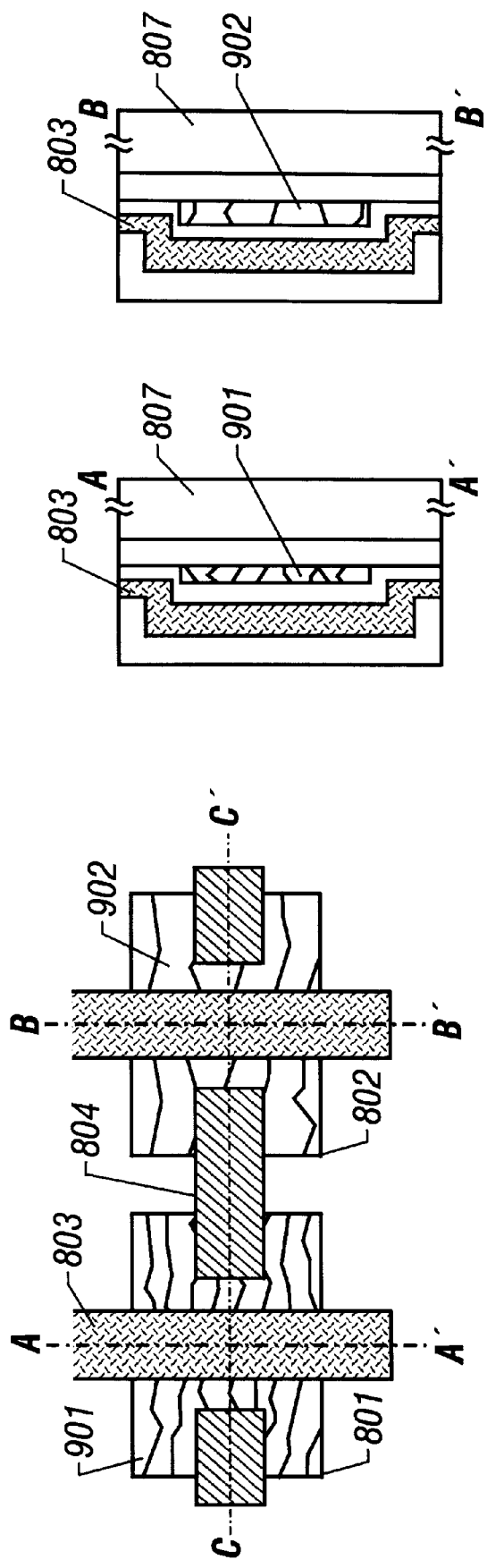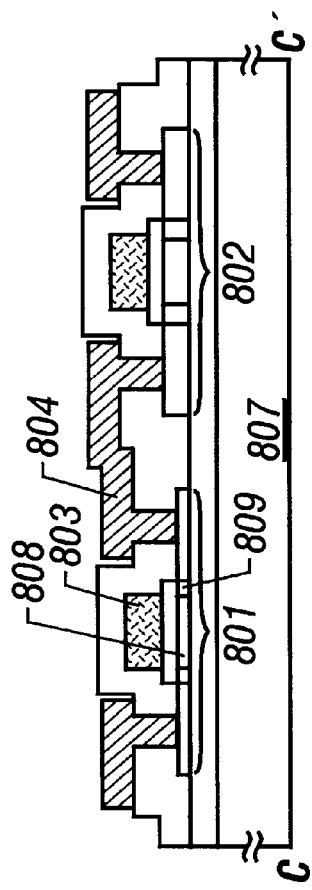
FIG. 9A
FIG. 9B
FIG. 9C
FIG. 9D

SEMICONDUCTOR DEVICE AND MANUFACTURING METHOD THEREOF

BACKGROUND OF THE INVENTION

1. Field of the Invention

The present invention relates to a semiconductor device that uses a semiconductor film having crystallinity and a manufacturing method of such a semiconductor device. In particular, the invention relates to a semiconductor device having a CMOS structure that uses a silicon film as a semiconductor film.

2. Description of the Related Art

In recent years, the CMOS technology using insulated-gate transistors has been developed extensively. However, as described in Japanese Unexamined Patent Publication Nos. Hei. 4-206971 and Hei. 4-286339, transistors using a crystalline silicon film as the active layer have such a tendency that the electrical characteristic is shifted to the depletion direction (negative side) in n-type transistors and to the enhancement direction (negative side) in p-type transistors. The reason for this tendency is considered the difference in work function between the gate electrode and the active layer that depends on the conductivity type.

FIG. 2 schematically shows the above-mentioned electrical characteristics (Id-Vg characteristics) of transistors. The horizontal axis represents the gate voltage Vg and the vertical axis represents the vertical axis represents the drain current Id. Reference numerals 201 and 202 denote Id-Vg characteristics of an n-type transistor and a p-type transistor, respectively. Intersections of the horizontal axis and the Id-Vg characteristics 201 and 202 indicate threshold voltages.

Reference numeral 203 denotes a window width Vwin which is defined as a difference between a threshold voltage $V_{th,\,n}$ of the n-type transistor and a threshold voltage $V_{th,\,p}$ of the p-type transistor, i.e., $V_{th,\,n}-V_{th,\,p}$. Further, reference numeral 204 denotes a window center Vcen which is defined as a value at the center of the window, i.e., $(\frac{1}{2})(V_{th,\,n}+V_{th,\,p})$.

In conventional CMOS circuits, since the window width Vwin is shifted to the negative side, the window center Vcen is smaller than 0 V. The above-mentioned publication No. Hei. 4-206971 points out that deviations of output voltages due to the difference between the threshold voltages cause deterioration in the characteristics of a CMOS circuit.

One method for solving this problem is to control the threshold voltages by adding, to the channel forming regions, an impurity (phosphorus or boron) that imparts one conductivity type (hereinafter called "channel doping method"). However, this method has a problem that impurity ions cause carrier scattering, possibly reducing the operation speed. In particular, in the deep submicron range in which the channel length is as short as 0.01–0.1 μm, only one to several impurity ions exist in the channel region. There is a report that the existence of impurity ions drastically changes the electrical characteristics.

It is now necessary to refer to a short channel effect preventing technique (pinning technique) that is proposed by the present inventors. This technique will be outlined below with reference to FIGS. 3A–3C. Although FIGS. 3A–3C show a thin-film transistor formed on an insulative substrate, the same things apply to a transistor formed within a semiconductor substrate.

The short channel effect is a generic term representing such phenomena as a reduction in breakdown voltage due to the punch-through phenomenon and deterioration of the subthreshold characteristic. These phenomena are caused such that the drain-side depletion layer expands to the source region to establish a situation that carriers cannot be controlled only by the gate voltage.

The pinning technique is a technique for preventing the expansion of the drain-side depletion layer by providing, artificially and locally, impurity regions in the channel forming region. The inventors use the term "pinning" as meaning "preventing."

Specifically, the active layer of a transistor is configured as shown in FIGS. 3A–3C. In FIG. 3A, reference numerals 301–303 denote a source region, a drain region, and a channel forming region, respectively. Impurity regions 304 are artificially formed in the channel forming region 303. In the channel forming region 303, regions 305 other than the impurity regions 304 are substantially intrinsic regions where carriers are allowed to move. Symbols L and W denote a channel length and a channel width, respectively.

The impurity regions 304 are obtained by forming a fine pattern by an electron beam lithography method or the like. Although FIG. 3A shows an example in which the impurity regions 304 are formed in a linear pattern, they may be formed in a dot pattern.

FIG. 3B is a sectional view taken along line A–A' in FIG. 3A.

Reference numeral 306 denotes a substrate having an insulative surface.

FIG. 3C is a sectional view taken along line B–B' in FIG. 3A.

The impurity regions 304, which are disposed in the channel forming region 303, form regions (energy barriers) where the diffusion potential is locally high in the channel forming region 303. The energy barriers can effectively prevent (i.e., pin) the drain-side depletion layer from expanding toward the source side.

Sufficiently high energy barriers can be formed by adding any of oxygen, nitrogen, and carbon. B (boron) and P (phosphorus) may be added in the cases of an n-type transistor and a p-type transistor, respectively.

With the above structure, it is expected that a reduction in threshold voltage as one aspect of the short channel effect can be prevented effectively. Naturally, it is also possible to prevent a reduction in breakdown voltage due to the punch-through phenomenon and deterioration of the subthreshold characteristic.

It is expected that the structure of FIGS. 3A–3C causes a narrow channel effect separately from the above effects. That is, a narrow channel effect can be caused artificially in the carrier movement regions 305 by sufficiently narrowing the intervals between the impurity regions 304.

As described above, the pinning technique that is proposed by the inventors is effective in such a range as covers device elements in which the short channel effect occur (channel length: 2 μm or less) and finer device elements in the deep submicron range (channel length: 0.01–0.1 μm).

However, the shift of the window center Vcen due to the difference in work function between the gate electrode and the active layer that was described above in the conventional example (FIG. 2) similarly occurs even if the pinning technique is employed. Therefore, in the submicron range, it is necessary to control the threshold voltages while preventing the short channel effect.

SUMMARY OF THE INVENTION

An object of the present invention is to correct a difference in threshold voltage by a method other than the channel doping method in a CMOS circuit that is miniaturized to such an extent that the short channel effect occurs (channel length: 0.01–2 μm).

In other words, an object of the invention is to provide a technique for making the window center Vcen as close to 0 V as possible, that is, for controlling the threshold voltages of n-channel and p-channel semiconductor devices so that their absolute values are substantially equalized.

The main point of the invention is to balance the threshold voltages Vth of a CMOS circuit, that is, to correct a difference therebetween, by utilizing the short channel effect (SCE) and the narrow channel effect (NCE) that occur as device elements are miniaturized.

According to the invention, there is provided a semiconductor device having a CMOS structure in which an n-channel semiconductor device and a p-channel semiconductor device are combined complementarily, comprising first means provided in the n-channel semiconductor, for strengthening a narrow channel effect; and second means provided in the p-channel semiconductor, for strengthening a short channel effect, wherein the first and second means are provided so as to make absolute values of threshold voltages of the n-channel and p-channel semiconductor devices approximately equal to each other.

More specifically, first impurity regions are formed in a channel forming region of the n-channel semiconductor device and second impurity regions are formed in a channel forming region of the p-channel semiconductor device artificially and locally so as to be approximately parallel with a channel direction, wherein the first means is for intentionally narrowing an interval between the first impurity regions; and wherein the second means is for making an interval between the second impurity regions wider than the interval between the first impurity regions.

According to another aspect of the invention, there is provided a semiconductor device having a CMOS structure in which an n-channel semiconductor device and a p-channel semiconductor device that are formed on a substrate having an insulative surface are combined complementarily, comprising first means provided in the n-channel semiconductor, for strengthening a narrow channel effect; and second means provided in the p-channel semiconductor, for strengthening a short channel effect, wherein the first and second means are provided so as to make absolute values of threshold voltages of the n-channel and p-channel semiconductor devices approximately equal to each other; an active layer of each of the n-channel and p-channel semiconductor devices is constituted of a crystal structural body that is a collection of needle-like or columnar crystals approximately parallel with the substrate and has grain boundaries having directivity; the first means is for intentionally narrowing a width of the needle-like or columnar crystals in the n-channel semiconductor device; and the second means is for making a width of the needle-like or columnar crystals in the p-channel semiconductor device larger than the width of the needle-like or columnar crystals in the n-channel semiconductor device.

In summary, the invention is intended to correct a difference between the absolute values of the threshold voltages of n-channel and p-channel semiconductor devices, which is problematic in manufacturing a semiconductor device having a CMOS structure, by a novel method that is different from the channel doping method.

To this end, the threshold voltages of the n-channel and p-channel semiconductor devices are shifted separately from each other by utilizing a reduction in the absolute voltage of the threshold voltage due to the short channel effect and an increase in the absolute value of the threshold voltage due to the narrow channel effect.

To cause the narrow channel effect to appear strongly, the intervals between the impurity regions disposed in the channel forming region are narrowed by utilizing the pinning technique, that is, the pinning effect is enhanced. Conversely, if the intervals between the impurity regions are designed to be wide, the pinning effect is reduced and the short channel effect appears strongly.

Where active layers are formed by utilizing a crystal structural body that is a collection of needle-like or columnar crystals, the same effects can be attained by controlling the crystal width. More specifically, the narrow channel effect can be strengthened by decreasing the crystal width and the short channel effect can be strengthened by increasing it. The crystal width can be controlled by controlling the thickness of an amorphous silicon film before being crystallized.

BRIEF DESCRIPTION OF THE DRAWINGS

FIG. 2 shows Id-Vg characteristics of conventional n-type and p-type transistors;

FIGS. 3A–3C show a structure of a thin-film transistor to which a pinning technique is applied;

FIGS. 4A–4D show a configuration of a CMOS circuit according to a second embodiment of the invention;

FIGS. 9A–9D show a configuration of a CMOS circuit according to a sixth embodiment of the invention;

DETAILED DESCRIPTION OF THE PREFERRED EMBODIMENTS

Embodiment 1

This embodiment is directed to a case where in designing a CMOS circuit by using insulated-gate transistors (IGFETs) that utilize the pinning effect, the active layers of the n-channel transistor and the p-channel transistor are configured differently. This embodiment can be applied to both of transistors formed on a semiconductor substrate and thin-film transistors (TFTs) formed on a substrate having an insulative surface.

As described above in the conventional example (see FIG. 2), in a case where channel forming regions are crystalline silicon films, there is the tendency that the electrical characteristic (Id-Vg characteristic) is shifted to the minus (i.e., negative) side both in n-type and p-type transistors and hence the window center Vcen is lower than 0 V.

Therefore, to set the window center Vcen at 0 V, it is necessary to increase the absolute value of the threshold voltage $V_{th, n}$ of the type transistor and decrease the absolute value of the threshold voltage $V_{th, p}$ of the p-type transistor.

To this end, the impurity regions may be disposed in the channel forming regions so that the narrow channel effect occurs more strongly in the active region of the n-type transistor and the short channel effect occurs more strongly in the p-type transistor. (Actually, strengthening the short channel effect means weakening the narrow channel effect relatively.)

Figure 1A:
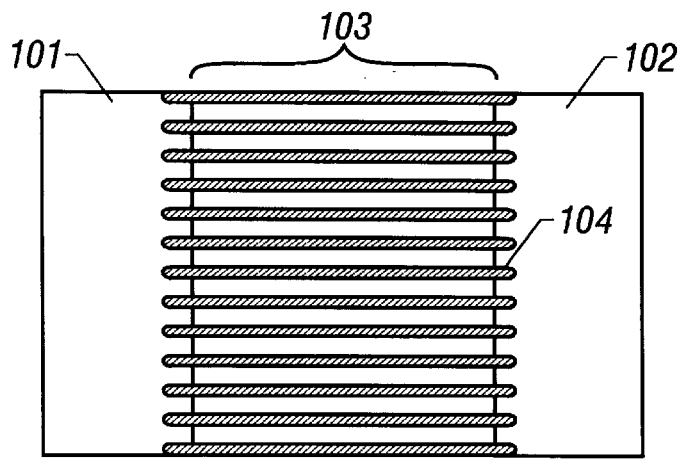
FIGS. 1A and 1C show structures of the active layers of n-type and p-type transistors, respectively, according to a first embodiment of the present invention.
Figure 1B:
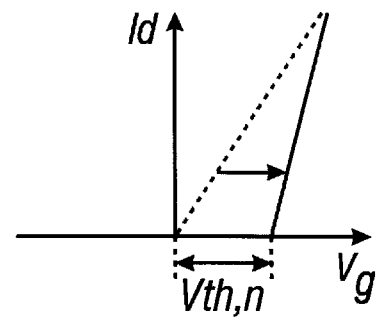
FIGS. 1B and 1D show Id-Vg characteristics of the n-type and p-type transistors, respectively.
Figure 1C:
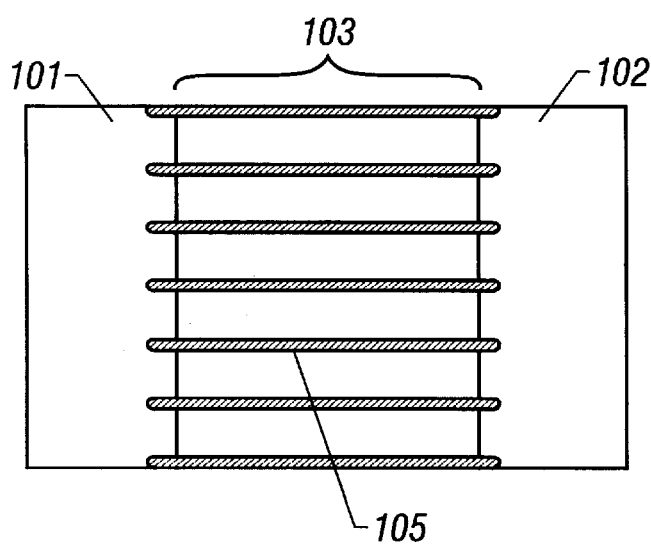
Figure 1D:
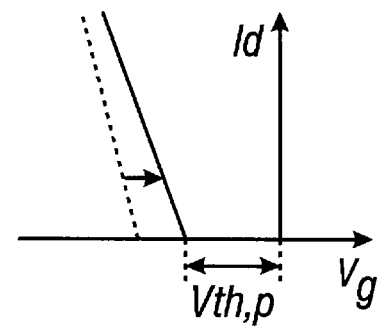

FIGS. 1A and 1C show, in a simplified manner, structures of an n-type and p-type transistors according to this embodiment, respectively. FIGS. 1B and 1D show Id-Vg characteristics of the n-type and p-type transistors, respectively. The channel length may be set in a range of 0.01–2 μm and the channel width may be set is an arbitrary range in consideration of a desired on-current and level of reliability.

In FIG. 1A, reference numerals 101–103 denote a source region, a drain region, and a channel forming region, respectively. The intervals between the impurity regions 104 are adjusted so as to obtain a desired threshold voltage. As shown in FIG. 1A, in the active layer of the n-type transistor, it is important that the intervals between the impurity regions 104 be set narrow so that the narrow channel effect occur strongly.

In practicing the invention, the necessary shifts of the threshold voltages depend on a party who practices the invention. That is, the intervals between the impurity regions 104 need to be designed experimentally so as to obtain a desired threshold voltage in view of the threshold voltage of an original semiconductor device intended by the party (to which the invention is not applied).

Typically, to strengthen the narrow channel effect, the intervals between the impurity regions 104 may be set at 30–1,000 Å (preferably 50–500 Å). In other words, the impurity regions 104 may be set so that the channel forming region 103 is divided into 100–1,000 parts in the width direction.

According to the invention, it is inferred that the n-type transistor having the active layer that is configured as shown in FIG. 1A provides a threshold voltage $V_{th, n}$ that is shifted as shown in FIG. 1B. In FIG. 1B, the solid line and the broken line represent threshold voltages of the cases where the invention is applied and not applied, respectively.

Thus, a structure that strengthen the narrow channel effect shifts the threshold voltage $V_{th, n}$ in the increasing direction. Further, since the effect of pinning the depletion layer is also strengthened, it is considered that the subthreshold characteristic is improved (the slope of the Id-Vg characteristic indicated by the solid line in FIG. 1B is increased).

As shown in FIG. 1C, in the active region of the p-type transistor, it is important that the intervals between impurity regions 105 be set wide so that the short channel effect occur strongly.

Typically, the short channel effect is strengthened by disposing the impurity regions 105 so that the channel forming region 103 is divided into 5–100 parts in the width direction. It is inferred that the threshold voltage $V_{th, p}$ of the p-type transistor is resultingly shifted as shown in FIG. 1D.

However, the strengthened short channel effect means deterioration of the electrical characteristic; as shown in FIG. 1D, the slope of the Id-Vg characteristic indicated by the solid line decreases. Therefore, attention should be paid to the balance between the deterioration of the characteristics and the control of the threshold voltage $V_{th, p}$.

As described above, it is possible to correct a difference between the absolute values of the threshold voltages of an n-type and p-type transistors of a CMOS circuit by controlling the threshold voltages by intentionally strengthening the short channel effect or the narrow channel effect. Thus, the invention is different from the previous pinning technique in that the intervals between the impurity regions are changed depending on the conductivity type.

The concept of utilizing the short channel effect and the narrow channel effect, which are conventionally considered only as the factors of preventing the miniaturization of devices, for control of the threshold voltage is entirely new, and the invention enables a threshold voltage control that does not use the channel doping method.

In the invention, the carrier movement regions in the channel forming region are intrinsic or substantially intrinsic regions.

The term "intrinsic or substantially intrinsic region" means a region where the activation energy is approximately equal to ½ of the band gap (that is, the Fermi level is located at the center of the forbidden band), the impurity concentration is lower than the spin density, and no impurity is added intentionally (undoped region).

Embodiment 2

In this embodiment, a configuration of a CMOS circuit formed on a semiconductor substrate by utilizing the first embodiment will be described with reference to FIGS. 4A–4D. Since the basic configuration of the CMOS circuit is known, in this embodiment only the necessary parts are given reference numerals and will be described below.

FIG. 4A is a top view of a CMOS circuit to which the invention is applied. An n-type transistor (left side) and a p-type transistor (right side) basically have the same structure. Reference numerals 401 and 402 denote active regions on which gate electrodes 403 and a data line 404 are provided.

Impurity regions 405 according to the pinning technique are disposed in the channel forming region of the active region 401 of the n-type transistor 401, and impurity regions 406 are similarly disposed in the channel forming region of the active region 402 of the p-type transistor.

According to the invention, the intervals between the impurity regions 405 are set smaller than those between the impurity regions 406. A party who practices the invention is required to experimentally determine specific values etc.

FIGS. 4B and 4C are sectional views taken along line A–A' and B–B' in FIG. 4A, respectively. Reference numeral 407 denotes a single crystal silicon substrate. A cross-section of the active region 401 in the channel width direction appears in FIG. 4B and a cross-section of the active region 402 in the channel width direction appears in FIG. 4C.

FIG. 4D is a sectional view taken along line C–C' in FIG. 4A.

Reference numerals 408 and 409 denote a field oxide film and a gate insulating film, respectively. In FIG. 4D, the impurity regions 405 and 406 are hatched in different manners to indicate that they are disposed at different densities in the n-type and p-type transistors.

As seen from FIGS. 4B and 4C, where the first embodiment is applied to a CMOS circuit, the intervals between the impurity regions 405 in the n-type transistor is narrower than those between the impurity regions 406 in the p-type transistor.

Embodiment 3

This embodiment is directed to CMOS circuits that are formed on a semiconductor substrate by utilizing the invention. This embodiment will be described with reference to FIGS. 5A–5C. Since the basic configuration of the CMOS circuit is known, in this embodiment only the essential parts are given reference numerals and will be described below.

Figure 5A:
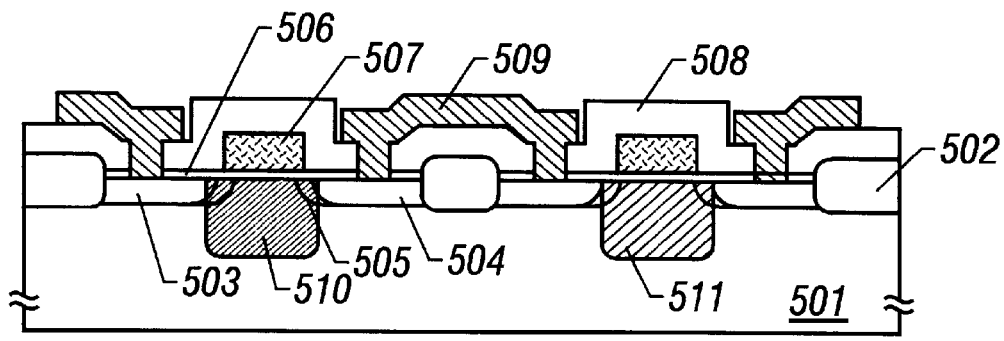
FIGS. 5A–5C show configurations of CMOS circuits according to a third embodiment of the invention.

FIG. 5A shows a CMOS circuit in which low-concentration impurity regions for reduction of electric field strength are provided between a channel forming region and source and drain regions. An n-type transistor and a p-type transistor are shown on the left side and the right side, respectively. Since the n-type and p-type transistors have basically the same structure except for the conductivity type, the n-type transistor will be mainly described below.

In FIG. 5A, reference numerals 501 and 502 denote a single crystal silicon substrate and a field oxide film, respectively. A source region 503, a drain region 504, and low-concentration impurity regions 505 constitute an active region. Reference numeral 506 denotes a gate insulating film; 507, a gate electrode; 508, an interlayer insulating film; and 509, a data line.

Impurity regions 510 and 511 according to the invention are disposed right under the respective gate electrodes 507. The impurity regions 510 and 511 are hatched in different manners to indicate that the intervals between the impurity regions 510 in the n-type transistor are smaller than those between the impurity regions 511 in the p-type transistor.

Figure 5B:
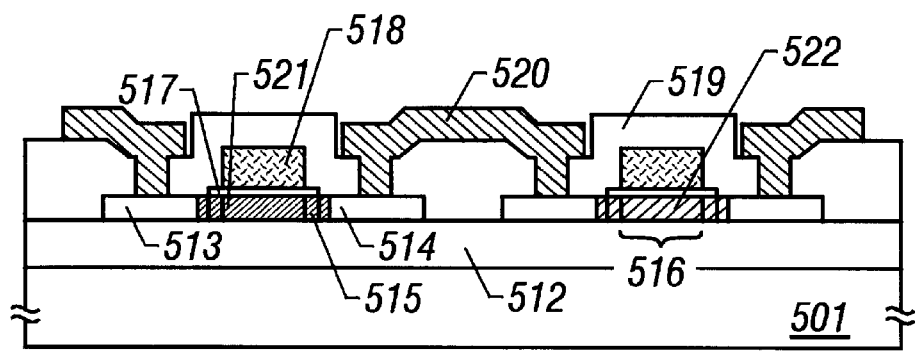

FIG. 5B shows a configuration in which the invention is applied to a CMOS circuit having a SOI structure. Although this embodiment (FIG. 5B) employs a SIMOX substrate as a SOI substrate, the invention can easily be applied to a SOS substrate, a bonded substrate, or the like. An n-type transistor and a p-type transistor are shown on the left side and the right side, respectively.

A source region 513, a drain region 514, low-concentration impurity regions 515, and a channel forming region 516 constitute an active layer that is a single crystal silicon thin film. Reference numeral 517 denotes a gate insulating film; 518, a gate electrode; 519, an interlayer insulating film; and 520, a data line.

As in the case of FIG. 5A, in FIG. 5B impurity regions 521 and 522 are hatched in different manners (but in the same manners as in FIG. 5A) to indicate that the intervals between the impurity regions 521 in the n-type transistor are smaller than those between the impurity regions 522 in the p-type transistor.

Figure 5C:
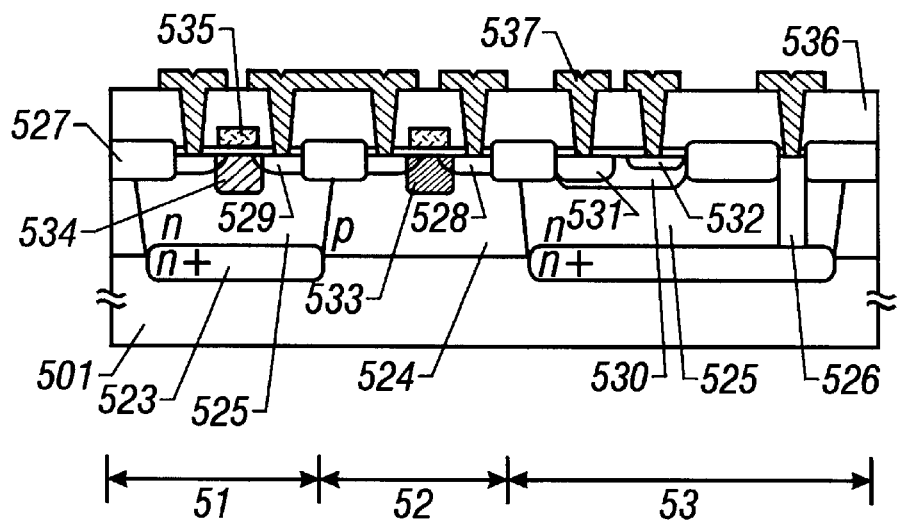

FIG. 5C shows a BiCMOS circuit as a combination of a CMOS circuit and a bipolar transistor. Reference numerals 51–53 denote a p-type transistor, an n-type transistor, and an npn bipolar transistor, respectively. Further, reference numerals 501, 523, and 524 denote a p-type silicon substrate, buried n+ regions, and an epitaxially grown p-well, respectively. The portions of the p-well 524 above the respective buried n+ regions 523 are inverted into n-wells 525 that serve as the collectors. Numeral 526 denotes a deep n+region that serves as a lead-out electrode for one of the buried n+ region 523.

Reference numeral 527 denotes a field oxide film formed by the ordinary selective oxidation method. N+ regions 528 are formed in the p-well 524 and p+ regions 529 are formed in one of the n-wells 525. In the other n-well 525 in the bipolar transistor, a p-type region 530 to become an active base is formed first and a p+ region 531 and an n+ region 532 to become external bases are then formed.

Impurity regions 533 and 534 are disposed in the p-type and n-type transistors, respectively. Naturally, according to the invention, the impurity regions 534 in the n-type transistor have narrower intervals than the impurity regions 533 in the p-type transistor.

Gate electrodes 535, an interlayer insulating film 536, and a data line 537 are then formed to complete the BiCMOS circuit. Since the BiCMOS circuit is a circuit configuration for effectively utilizing both of the high operation speed of the bipolar transistor and the lower power consumption of the CMOS circuit, the fact that the power consumption is reduced in the CMOS circuit by virtue of the invention is very meaningful.

The above-described CMOS circuit configurations are just examples, and a party who practices the invention can apply the invention to other configurations as they desire. For example, the invention can be applied to a multi-gate (double-gate or triple-gate) CMOS circuit and a CMOS circuit constituted of inverted staggered structure FETs.

Embodiment 4

This embodiment is directed to a technique for balancing the threshold voltages $V_{th,\,n}$ and $V_{th,\,p}$ by controlling the short channel effect and the narrow channel effect by a method different than in the first embodiment. More specifically, this embodiment utilizes crystal widths of a polysilicon film. This embodiment can be applied to thin-film transistors (TFTs).

A crystalline silicon film (polysilicon film) that is crystallized according to the technique of the inventors that is disclosed in Japanese Unexamined Patent Publication No. Hei. 6-244103 or Hei. 7-321339 is a crystal structural body that is a collection of needle-like (or columnar) crystals. By performing a heat treatment on such a crystal structural body in an atmosphere containing a halogen element, a crystalline silicon film is obtained that is much superior in crystallinity.

The inventors have confirmed experimentally that a semi-conductor device using such a crystalline silicon film as an active layer exhibits superior electrical characteristics equivalent to those of a MOSFET formed on single crystal silicon. Specifically, the electrical characteristics are such that the subthreshold characteristic (S-value) is 60–100 mV/dec (preferably 60–70 mV/dec) and the threshold voltages $V_{th,\,n}$ and $V_{th,\,p}$ are −0.5 to 2.0 V and −2.0 to 0.5 V, respectively.

However, the threshold voltages deviate depending on the conductivity type of the active layer as described above; typically, $V_{th,\,n}$ and $V_{th,\,p}$ are in the ranges of −0.5 to 0.5 V and −1.5 to −0.5 V and the window center Vcen is located in the range of −1.0 to −0.5 V. This embodiment is a technique for shifting the window center Vcen of a semi-conductor device to the positive side by 0.5–1.0 V.

Figure 6:
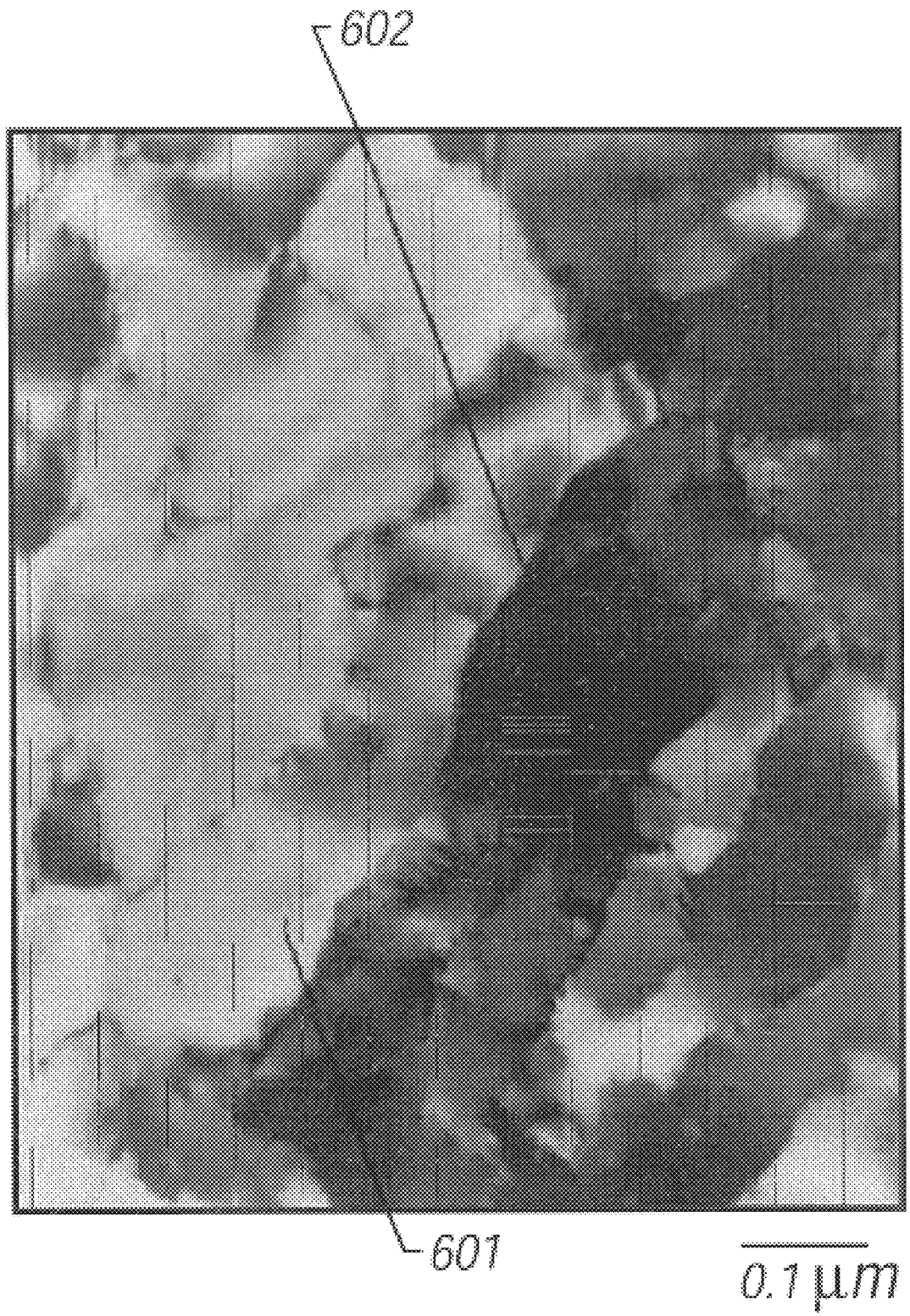
FIG. 6 is a TEM photograph of a needle-like crystals.

FIG. 6 is a TEM photograph of a crystal structural body as mentioned above. As seen from FIG. 6, this crystal structural body has regularity that needle-like crystals 601 extend approximately in the same direction. Also their grain boundaries 602 extend approximately parallel with each other.

The inventors inferred that the condition for attaining the best electrical characteristics is that the growing direction of the needlelike crystals 601 coincides with the direction connecting the source region and the drain region of the active layer (i.e., the channel direction). The pinning technique was completed by schematically modeling the crystal structural body with the grain boundaries regarded as energy barrier regions.

That is, narrowing the width of needle-like crystals corresponds to obtaining the structure of FIG. 1A in which the narrow channel effect occurs strongly. Conversely, widening the crystal width corresponds to obtaining the structure of FIG. 1C in which the short channel effect occurs strongly.

According to the knowledge of the inventors that was acquired experimentally, the width of needle-like crystals is approximately equal to the thickness of an amorphous silicon film before being crystallized. Therefore, a crystal structural body with narrow crystals (for strengthening of the narrow channel effect) may be obtained by decreasing the thickness of an amorphous silicon film, and a crystal structural body with wide crystals (for strengthening of the short channel effect) may be obtained by increasing the thickness of an amorphous silicon film.

Figure 7A:
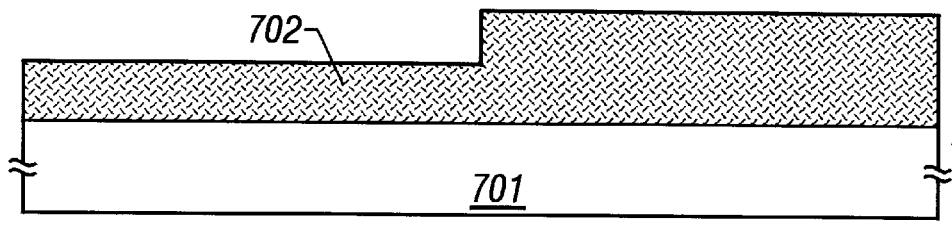
FIGS. 7A–7E show a manufacturing method of a crystalline silicon film according to a fourth embodiment of the invention.

A manufacturing method of a crystalline silicon film for practicing this embodiment will be described below with reference to FIGS. 7A–7E. FIG. 7A shows only a particular, small portion of a substrate. In FIG. 7A, reference numeral 701 denotes a quartz substrate. Although a glass substrate may be used, a quartz substrate needs to be used in view of heat resistance in a case where a heat treatment step of more than 700° C. follows.

An amorphous silicon film 702 is formed on the quartz substrate 701. In this embodiment, it is important that the amorphous silicon film 702 be partially thinned (from the thickness at the time of the film formation). The thinning may be performed by a half etching technique or the like. Naturally the thinning should be effected in a region to become the active layer of an n-type transistor.

After the selective thinning of the amorphous silicon film 702, crystallization is performed by using the technique of the abovementioned publication No. Hei. 6-244103 or Hei. 7-321339. To equalize the growing direction with the channel direction by controlling the crystal growth direction of needle-like crystals, it is effective to use the technique of the publication No. Hei. 7-321339.

Figure 7B:
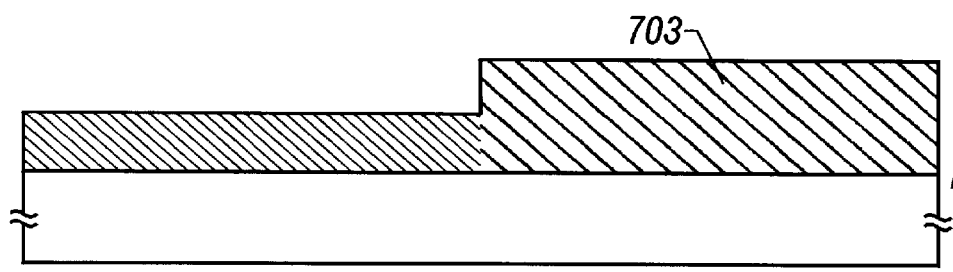
Figure 7C:
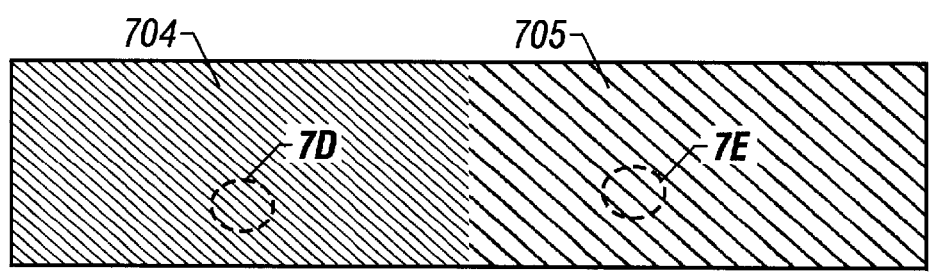

Thus, a crystalline silicon film 703 having regions of different thicknesses is obtained as shown in FIG. 7B. FIG. 7C is a top view of the crystalline silicon film 703 that is divided into a thinner first region 704 and a thicker second region 705.

Figure 7D:
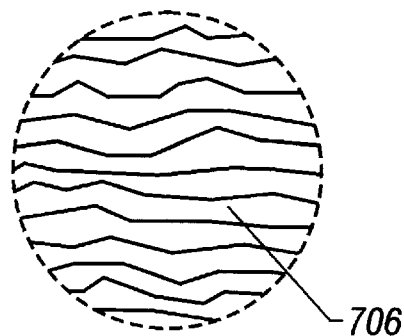
Figure 7E:
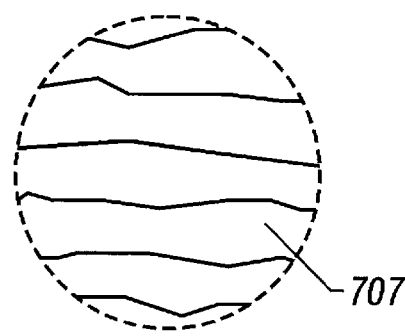

FIGS. 7D and 7E schematically show enlarged portions of the first and second regions 704 and 705, respectively. As shown in FIG. 7D, needle-like crystals have narrow widths because in this region the amorphous silicon film 702 is thin at the time of the crystallization. As shown in FIG. 7E, needle-like crystals 707 are wider than the needle-like crystals 706 because the second region 705 is thicker.

Therefore, when the crystal structural body shown in FIG. 7D a is used as an active layer, it is expected that the pinning effect (the effect of preventing expansion of the drain-side depletion layer) is strengthened and that the narrow channel effect is enhanced because the needle-like crystals are narrow. Conversely, when the crystal structural body shown in FIG. 7E is used as an active layer, it is expected that the pinning effect is weakened and the short channel effect appears.

As described above, it is possible to design n-type and p-type transistors so that they have desired threshold voltage values by controlling the influences of the narrow channel effect and the short channel effect by controlling the width of needle-like crystals.

Embodiment 5

In this embodiment, a configuration of a CMOS circuit constituted of TFTs and utilizing the first embodiment will be described with reference to FIGS. 8A–8D. Since the basic configuration of the CMOS circuit is known, in this embodiment only the necessary parts are given reference numerals and will be described below.

Figure 8C:
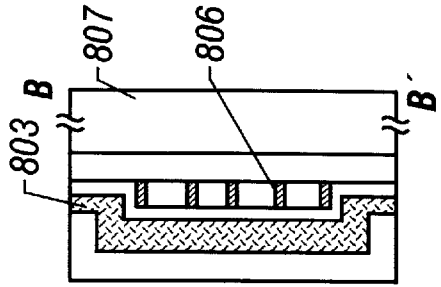
FIGS. 8A–8D show a configuration of a CMOS circuit according to a fifth embodiment of the invention.
Figure 8B:
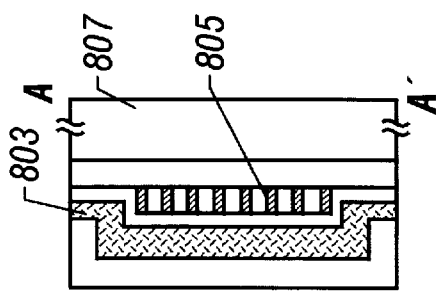
Figure 8A:
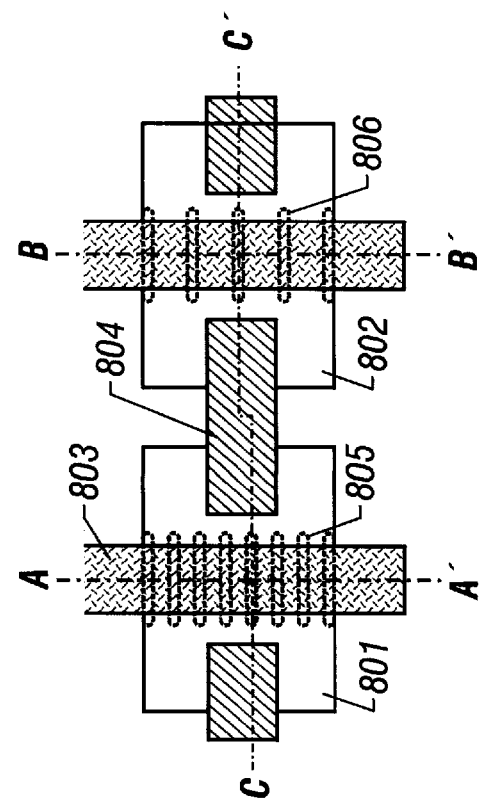

FIG. 8A is a top view of a CMOS circuit to which the invention is applied. An n-channel TFT (left side) and a p-channel TFT (right side) basically have the same structure. Reference numerals 801 and 802 denote active layers on which gate electrodes 803 and a data line 804 are provided.

Impurity regions 805 according to the pinning technique are disposed in the channel forming region of the active layer 801 of the n-type transistor 801, and impurity regions 806 are similarly disposed in the channel forming region of the active layer 802 of the p-type transistor.

According to the invention, the intervals between the impurity regions 805 are set smaller than those between the impurity regions 806. A party who practices the invention is required to experimentally determine specific values etc.

FIGS. 8B and 8C are sectional views taken along line A–A' and B–B' in FIG. 8A, respectively. Reference numeral 807 denotes a substrate having an insulative surface. A cross-section of the active layer 801 in the channel width direction appears in FIG. 8B and a cross-section of the active layer 802 in the channel width direction appears in FIG. 8C.

Figure 8D:
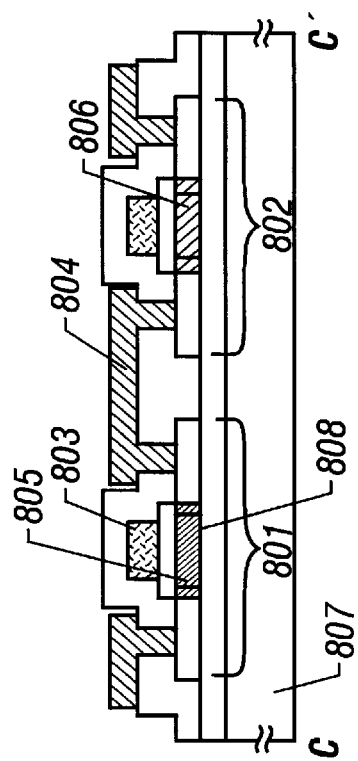

FIG. 8D is a sectional view taken along line C–C' in FIG. 8A. Reference numerals 807 and 808 denote the substrate having an insulative surface and channel forming regions right under the respective gate electrodes, respectively. In FIG. 8D, the impurity regions 805 and 806 are hatched in different manners to indicate that they are disposed at different densities in the n-type and p-type transistors.

As seen from FIGS. 8B and 8C, where the first embodiment is applied to a CMOS circuit, the intervals between the impurity regions 805 in the n-type transistor is narrower than those between the impurity regions 806 in the p-type transistor.

Embodiment 6

In this embodiment, a configuration of a CMOS circuit constituted of TFTs and utilizing the fourth embodiment will be described with reference to FIGS. 9A–9D. This embodiment is different from the fifth embodiment (FIGS. 8A–8D) in that the narrow channel effect is controlled by the width of needle-like crystals rather than the impurity regions.

FIG. 9A shows a top view of a CMOS circuit to which the invention is applied. An n-channel TFT and a p-channel TFT are shown on the left side and the right side, respectively. The parts in FIGS. 9A–9D that are the same as in FIGS. 8A–8D are given the same reference numerals. Reference numerals 901 and 902 denote needle-like crystals constituting the active layers 801 and 802, respectively.

This embodiment has a feature that according to the invention the width of the needle-like crystals 901 is set smaller than that of the needle-like crystals 902. The crystal width may be controlled by the means described in the fourth embodiment. A part who practices the invention needs to experimentally determine a specific width. Typically, the width of the needle-like crystals 901 may be set at 50–500 Å (preferably 50–200 Å).

FIGS. 9B and 9C are sectional views taken along line A–A' and B–B' in FIG. 9A, respectively. A cross-section of the active layer 801 in the channel width direction appears in FIG. 9B and a cross-section of the active layer 802 in the channel width direction appears in FIG. 9C. FIG. 9D is a sectional view taken along line C–C' in FIG. 9A.

As seen from FIGS. 9B and 9C, where the fourth embodiment is applied to a CMOS circuit, the width of the needle-like crystals 901 constituting the active layer 801 of the n-type transistor is smaller than that of the needle-like crystals 902 constituting the active layer 802 of the p-type transistor.

Embodiment 7

This embodiment is directed to CMOS circuits to which the invention is applied. This embodiment will be described with reference to FIGS. 10A–10C. In this embodiment, the invention is practiced by using the means of the fourth embodiment. In each of FIGS. 10A–10C, an n-type transistor and a p-type transistor are shown on the left side and the right side, respectively. Since the basic structure of the CMOS circuit is known, only the parts specific to the embodiment are given reference numerals and will be described below.

Figure 10A:
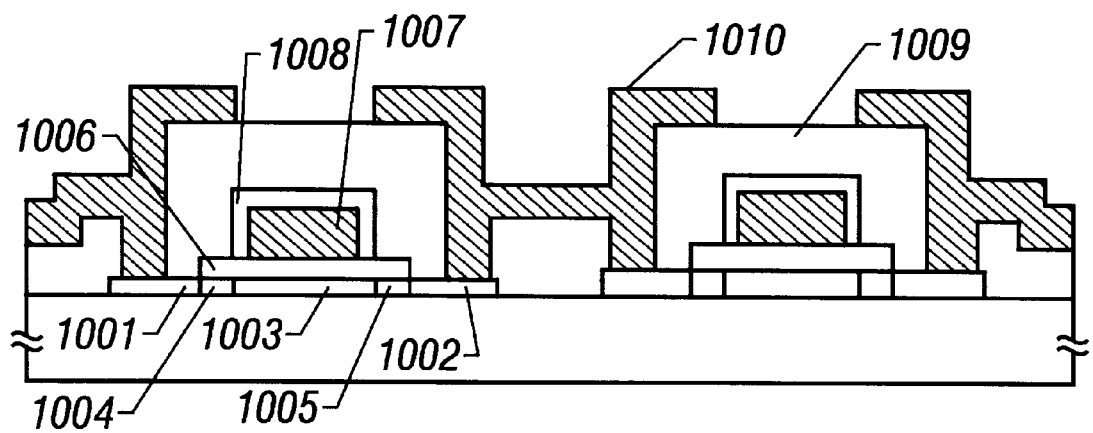
FIGS. 10A–10C show configurations of CMOS circuits according to a seventh embodiment of the invention.

In a CMOS circuit shown in FIG. 10A, low-concentration impurity regions for reduction of electric field strength are provided between a channel forming region and source and drain regions by using the technique disclosed in Japanese Unexamined Patent Publication No.

Hei. 7-135318. Since the n-type and p-type transistors have basically the same structure except for the conductivity type, the n-type transistor will be mainly described below.

In FIG. 10A, a source region 1001, a drain region 1002, a channel forming region 1003, and low-concentration impurity regions 1004 and 1005 constitute an active layer. Reference numerals 1006 and 1007 denote a gate insulating film and a gate electrode mainly made of aluminum, respectively. The gate electrode 1007 is protected by an anodic oxide film 1008. Further, reference numerals 1009 and 1010 denote an interlayer insulating film and a data line, respectively.

The gate insulating film 1006 remains only on portions of the active layer because an original insulating film is etched by using, as a mask, porous anodic oxide films (removed in the process for forming the CMOS circuit) that are formed on the side faces of the gate electrode 1007. The low-concentration impurity regions 1004 and 1005 are formed by utilizing the end portions of the gate insulating film 1006.

Figure 10B:
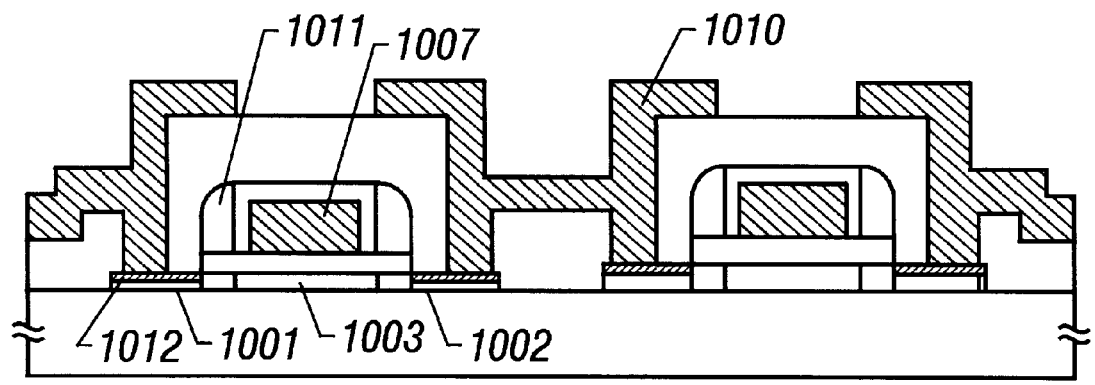

Next, FIG. 10B shows a CMOS circuit that is formed by using the technique of the above-mentioned publication No. Hei. 7-135318 but replacing the porous anodic oxide films with sidewalls made of an insulating material. Therefore, the structure of an active layer is basically the same as shown in FIG. 10A.

Sidewalls 1011 are formed by leaving a silicon nitride film or a silicon oxide film only on the side faces of a gate electrode 1007 by an etch back method. The sidewalls 1011 are also necessary in forming silicide films on the principal surfaces of a source region 1001 and a drain region 1002.

The silicide films 1012 may be formed by a known silicide forming technique. For example, such metals as titanium, tantalum, molybdenum, and tungsten can be used. It is possible to employ such conditions that the entire source and drain regions 1001 and 1002 are silicified.

The semiconductor devices having the silicide structure as shown in FIG. 10B can increase the operation speed because good ohmic contact can be obtained with the data line 1010.

Figure 10C:
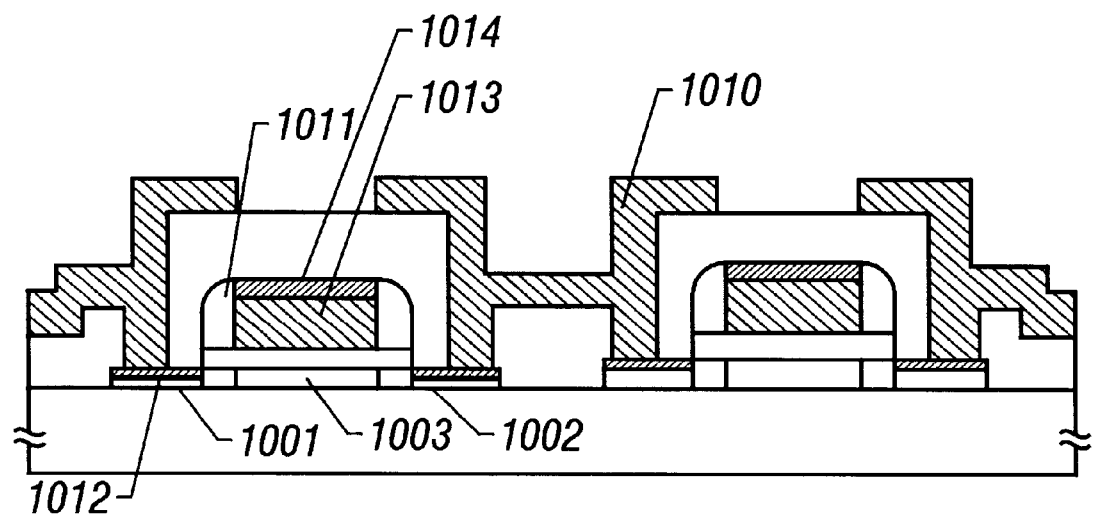

Next, FIG. 10C shows a CMOS circuit in which the material of the gate electrodes is changed to crystalline silicon (polysilicon) in the CMOS circuit of FIG. 10B. While sidewalls 1011 are formed on the side faces of gate electrodes 1013 as in the case of FIG. 10B, a silicide film 1014 is also formed on the principal surface of the gate electrode 1013.

Although not shown in FIG. 10C, the gate electrode 1013 is connected to a lead-out line for transmitting a gate signal. Therefore, this configuration can provide good ohmic contact with such a lead-out line.

The above-described CMOS circuit configurations are just examples, and a party who practices the invention can apply the invention to other configurations as they desire. For example, the invention can be applied to a multi-gate (double-gate or triple-gate) CMOS circuit and a CMOS circuit constituted of inverted staggered structure TFTs.

Embodiment 8

A semiconductor device utilizing the invention can also be applied to an active matrix electro-optical device in which a pixel matrix circuit and logic circuits are integrated on the same substrate. The electro-optical device includes a liquid crystal display device, an EL display device, and an EC display device.

The logic circuits mean an integrated circuit for driving the electro-optical device, such as peripheral driver circuits and a control circuit. The control circuit includes all electrical circuits (other than the peripheral driver circuits) necessary for driving the electro-optical device, such as a processor circuit, a memory circuit, a clock generation circuit, and an A/D (D/A) converter circuit.

TFTs utilizing the invention can provide a high-performance integrated circuit because their threshold voltages are controlled without sacrificing the operation speed. By setting the window center Vcen at 0 V and narrowing the window width Vwin, the necessary drive voltage can be reduced, which enables manufacture of a low power consumption electro-optical device.

Embodiment 9

The term "semiconductor device" as used in this specification generally mean devices that function by utilizing a semiconductor, and hence includes an FET itself, a TFT itself, semiconductor integrated circuits (logic circuits such as a CMOS circuit, a DRAM circuit, and an SRAM circuit), and an active matrix electro-optical device, and even their application products.

Such application products will be described in this embodiment with reference to the drawings. Semiconductor device utilizing the invention include a TV camera, a head-mounted display, a car navigation apparatus, a projection apparatus (a front type and a rear type), a video camera, and a personal computer, which will be described briefly with reference to FIGS. 11A–11F.

Figure 11A:
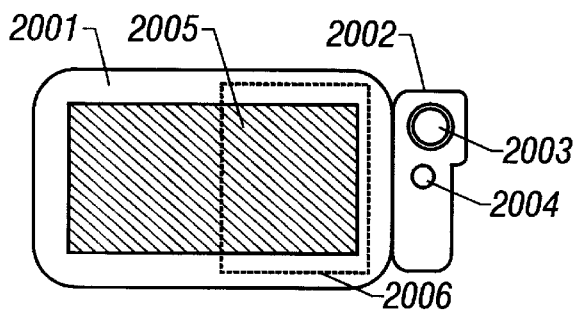
FIGS. 11A–11F show examples of semiconductor devices (application products) according to a ninth embodiment of the invention.

FIG. 11A shows a TV camera which consists of a main body 2001, a camera section 2002, an image receiving section 2003, a manipulation switch 2004, and a display device 2005. The invention is applied to the display device 2005 and an integrated circuit 2006 that is provided inside the device.

Figure 11B:
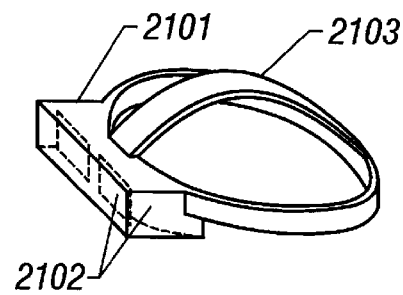

FIG. 11B shows a head-mounted display which consists of a main body 2101, two display devices 2102 of a relatively small size, and a band section 2103.

Figure 11C:
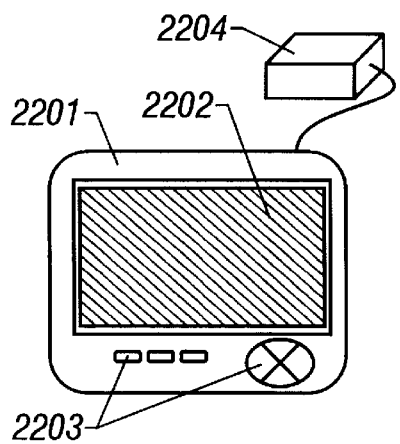

FIG. 11C shows a car navigation apparatus which consists of a main body 2201, a display device 2202, manipulation switches 2203, and an antenna 2204. The invention can be applied to the display device 2202 and an integrated circuit that is provided inside the device. Highly reliable semiconductor devices that are less affected by a voltage variation are needed because of the vehicular use. Although the display device 2202 is used as a monitor, the allowable resolution range is relatively wide because its main purpose is display of a map.

Figure 11D:
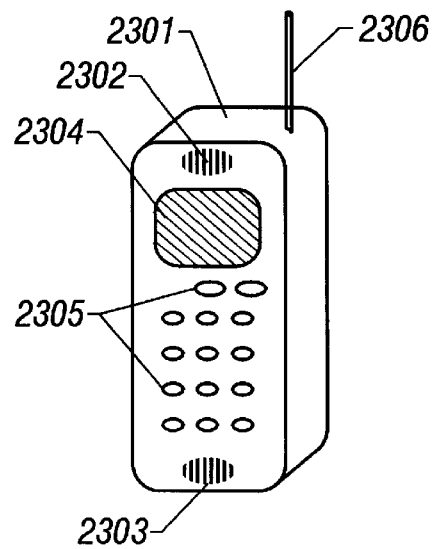

FIG. 11D shows a cellular telephone which consists of a main body 2301, a voice output section 2302, a voice input section 2303, a display device 2304, manipulation buttons 2305, and an antenna 2306.

The invention can be applied to the display device 2304 and an integrated circuit that is provided inside the device. It can be said that the invention is very effective in this case because reducing the power consumption in a standby state is important in the cellular telephone.

Figure 11E:
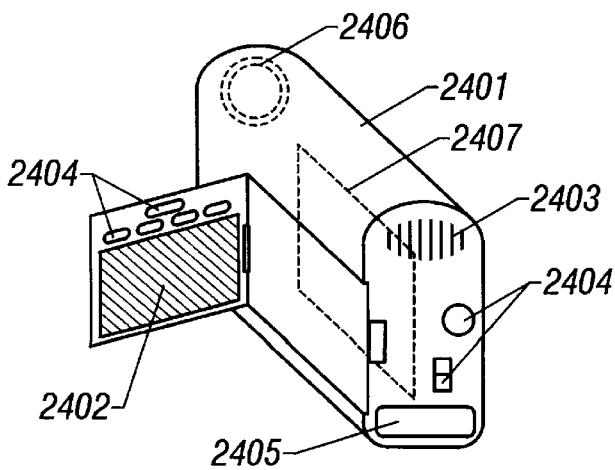

FIG. 11E shows a video camera which consists of a main body 2401, a display device 2402, a voice input section 2403, manipulation switches 2404, a battery 2405, and an image receiving section 2406.

The invention can be applied to the display device 2402 and an integrated circuit 2407 that is provided inside the device. Reducing the power consumption according to the invention is very meaningful because the video camera is required to operate for a long time in a battery-driven state.

Figure 11F:
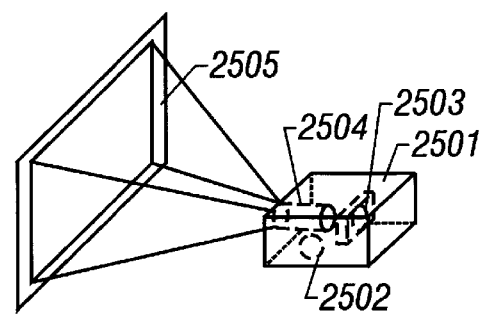

FIG. 11F shows a front projection apparatus which consists of a main body 2501, a light source 2502, a reflection-type display device 2503, an optical system (including a beam splitter, a polarizer, etc.) 2504, and a screen 2505. The display device 2503 is required to have high resolution because the screen 2505 is a large-size screen to be used for presentation in a conference, a meeting of a scientific society, or the like.

The application range of the semiconductor device according to the invention is not limited to the electro-optical devices of this embodiment, and it can also be applied to a rear projection apparatus and such portable information terminal apparatuses as a handy terminal. As such, the application range of the invention is very wide; the invention can be applied to display media of every field.

The application range of the TFT according to the invention is not limited to the electro-optical device. For example, it may be incorporated in an integrated circuit in the form of an SRAM or a DRAM and may be used as a driver circuit of the application products described in this embodiment.

By utilizing the short channel effect and the narrow channel effect that occur as device elements are miniaturized, the difference between the threshold voltages Vth of a CMOS circuit can be corrected without using the channel doping method.

Therefore, the invention can not only prevent a reduction in operation speed and erroneous operation of a CMOS circuit that result from deviations of the threshold voltages, but also realize a semiconductor device in which the operation speed is increased by lowering the influence of impurity scattering in the channel forming regions. Further, since the absolute values of the threshold voltages of a semiconductor device, its power consumption can be reduced.

Further, by virtue of energy barriers (impurity regions or S grain boundaries) that are formed in the channel forming regions approximately parallel with the channel direction, a highly reliable semiconductor device can be realized that is free of deteriorations of the characteristics due to the short channel effect even in a fine range of 0.01–2 $\mu$m (channel length).

What is claimed is:

1. A CMOS semiconductor device having a source region, a drain region and a channel forming region, having complementary n-channel semiconductor device and p-channel semiconductor device, comprising:

first means provided in the n-channel semiconductor device for strengthening a narrow channel effect;

second means provided in the p-channel semiconductor device for strengthening a short channel effect; and first impurity regions in said channel forming region of the n-channel semiconductor device and second impurity regions in said channel forming region of the p-channel semiconductor device, the first and second impurity regions being formed artificially and locally so as to be approximately parallel with a channel direction, wherein the first and second means are configured so as to calculate absolute values of threshold voltages of the n-channel and p-channel semiconductor devices to be approximately equal to each other;

wherein the first means is for intentionally narrowing an interval between the first impurity regions; and wherein the second means is for making an interval between the second impurity regions wider than the interval between the first impurity regions.

2. A CMOS semiconductor device having a source, region, a drain region, and a channel forming region, having complementary n-channel semiconductor device and p-channel semiconductor device, comprising:

first impurity regions disposed in said channel forming region of the n-channel semiconductor device; and second impurity regions disposed in said channel forming region of the p-channel semiconductor device, the first and second impurity regions being formed artificially and locally so as to be approximately parallel with a channel direction, wherein an interval between the first impurity regions is made narrower than an interval between the second impurity regions so as to make absolute values of threshold voltages of the n-channel and p-channel semiconductor devices approximately equal to each other.

3. The semiconductor device according to claim 1 or 2, wherein at least said channel forming region in each of the n-channel and p-channel semiconductor devices comprises single crystal silicon.

4. A semiconductor device having a CMOS structure in which a complementary n-channel semiconductor device and p-channel semiconductor device are formed on a substrate having an insulative surface, comprising:

first means provided in the n-channel semiconductor device, for strengthening a narrow channel effect;

second means provided in the P-channel semiconductor device, for strengthening a short channel effect; and first impurity regions in a channel forming region of the n-channel semiconductor device and second impurity regions in a channel forming region of the p-channel semiconductor device, the first and second impurity regions being formed artificially and locally so as to be approximately parallel with a channel direction, wherein the first and second means are configured so as to calculate absolute values of threshold voltages of the n-channel and p-channel semiconductor devices to be approximately equal to each other;

wherein the first means is for intentionally narrowing an interval between the first impurity regions; and wherein the second means is for making an interval between the second impurity regions wider than the interval between the first impurity regions.

5. A semiconductor device having a CMOS structure in which a complementary n-channel semiconductor device and p-channel semiconductor device are formed on a substrate having an insulative surface, comprising:

an active layer constituting a crystal structural body that includes a collection of needle-like or columnar crystals approximately parallel with the substrate and having grain boundaries having directivity;

first means provided in the n-channel semiconductor device for intentionally narrowing a width of the needlelike or columnar crystals in the n-channel semiconductor device;

second means provided in the p-channel semiconductor device for making a width of the needle-like or columnar crystals in the p-channel semiconductor device larger than the width of the needle-like or columnar crystals in the n-channel semiconductor device; and wherein the first and second means are configured so as to calculate absolute values of threshold voltages of the n-channel and p-channel semiconductor devices to be approximately equal to each other.

6. A semiconductor device having a CMOS structure in which an n-channel semiconductor device and a p-channel semiconductor device that are formed on a substrate having an insulative surface are combined complementarily, comprising:

first impurity regions disposed in a channel forming region of the n-channel semiconductor device; and second impurity regions disposed in a channel forming region of the p-channel semiconductor device, the first and second impurity regions being formed artificially and locally so as to be approximately parallel with a channel direction, wherein an interval between the first impurity regions is made narrower than an interval between the second impurity regions so as to make absolute values of threshold voltages of the n-channel and p-channel semiconductor devices approximately equal to each other.

7. A semiconductor device having a CMOS structure in which an n-channel semiconductor device and a p-channel semiconductor device that are formed on a substrate having an insulative surface are combined complementarily, wherein:

an active layer of each of the n-channel and p-channel semiconductor devices is constituted of a crystal structural body that is a collection of needle-like or columnar crystals approximately parallel with the substrate and has grain boundaries having directivity; and a width of the needle-like or columnar crystals of the crystal structural body in the n-channel semiconductor device is made smaller than a width of the needle-like or columnar crystals of the crystal structural body in the p-channel semiconductor device so as to make absolute values of threshold voltages of the n-channel and p-channel semiconductor devices approximately equal to each other.

8. The semiconductor device according to claim 7, wherein a film thickness of the active layer of the n-channel semiconductor device is smaller than that of the active layer of the p-channel semiconductor.

9. The semiconductor device according to claim 4 or 6, wherein at least the channel forming region of each of the n-channel and p-channel semiconductor devices is constituted of a polysilicon film.

10. The semiconductor device according to claim 6, wherein the first and second impurity regions are doped with one or a plurality of elements selected from the group consisting of oxygen, nitrogen, and carbon.

11. The semiconductor device according to claim 6, wherein the first impurity regions are doped with boron and the second impurity regions are doped with phosphorus.

12. A semiconductor device comprising:

a substrate;

a p-type transistor comprising a first semiconductor film over the substrate;

an n-type transistor comprising a second semiconductor film over the substrate, wherein the first semiconductor film has at least a first source region, a first drain region and a first channel forming region formed between the first source region and the first drain region, said first channel forming region having a channel length of 0.01 to 2 μm and comprising first impurity regions and first carrier movement regions;

wherein the second semiconductor film has at least a second source region, a second drain region and a second channel forming region formed between the second source region and the second drain region, said second channel forming region having a channel length of 0.01 to 2 μm and a channel width and comprising second impurity regions and second carrier movement regions; and wherein said second impurity regions are arranged along a direction of the channel width with an interval of 30 to 1000 Å.

13. The semiconductor device according to claim 12, wherein said substrate has an insulative surface.

14. The semiconductor device according to claim 12, wherein said first impurity regions comprise an impurity selected from oxygen, nitrogen, carbon and phosphorus.

15. The semiconductor device according to claim 12, wherein said second impurity regions comprise an impurity selected from oxygen, nitrogen, carbon and boron.

16. The semiconductor device according to claim 1, further comprising a main body, a camera section, an image receiving section, a manipulation switch and a display device operationally connected to constitute a TV camera, wherein said display device comprises said n-channel semiconductor device and said p-channel semiconductor device.

17. The semiconductor device according to claim 1, further comprising a main body, two display devices and a band section operationally connected to constitute a head-mounted display, wherein each of said display devices comprises said n-channel semiconductor device and said p-channel semiconductor device.

18. The semiconductor device according to claim 1, further comprising a main body, a display device, manipulation switches and an antenna operationally connected to constitute a car navigation apparatus, wherein said display device comprises said n-channel semiconductor device and said p-channel semiconductor device.

19. The semiconductor device according to claim 1, further comprising a main body, a voice output section, a voice input section, a display device, manipulation buttons and an antenna operationally connected to constitute a cellular telephone, wherein said display device comprises said n-channel semiconductor device and said p-channel semiconductor device.

20. The semiconductor device according to claim 1, further comprising a main body, a display device, a voice input section, manipulation switches, a battery and an image receiving section operationally connected to constitute a video camera, wherein said display device comprises said n-channel semiconductor device and said p-channel semiconductor device.

21. The semiconductor device according to claim 1, further comprising a main body, a light source, a reflection-type display device, an optical system and a screen operationally connected to constitute a front projection apparatus, wherein the reflection-type display device comprises the n-channel semiconductor device and said p-channel semiconductor device.

22. The semiconductor device according to claim 1, wherein the semiconductor device is an integrated circuit selected from a SRAM circuit and a DRAM circuit.

23. The semiconductor device according to claim 2, further comprising a main body, a camera section, an image receiving section, a manipulation switch and a display device operationally connected to constitute a TV camera, wherein said display device comprises said n-channel semiconductor device and said p-channel semiconductor device.

24. The semiconductor device according to claim 2, further comprising a main body, two display devices and a band section operationally connected to constitute a head-mounted display, wherein each of said display devices comprises said n-channel semiconductor device and said p-channel semiconductor device.

25. The semiconductor device according to claim 2, further comprising a main body, a display device, manipulation switches and an antenna operationally connected to constitute a car navigation apparatus, wherein said display device comprises said n-channel semiconductor device and said p-channel semiconductor device.

26. The semiconductor device according to claim 2, further comprising a main body, a voice output section, a voice input section, a display device, manipulation buttons and an antenna operationally connected to constitute a cellular telephone, wherein said display device comprises said n-channel semiconductor device and said p-channel semiconductor device.

27. The semiconductor device according to claim 2, further comprising a main body, a display device, a voice input section, manipulation switches, a battery and an image receiving section operationally connected to constitute a video camera, wherein said display device comprises said n-channel semiconductor device and said p-channel semiconductor device.

28. The semiconductor device according to claim 2, further comprising a main body, a light source, a reflection-type display device, an optical system and a screen operationally connected to constitute a front projection apparatus, wherein the reflection-type display device comprises the n-channel semiconductor device and said p-channel semiconductor device.

29. The semiconductor device according to claim 2, wherein the semiconductor device is an integrated circuit selected from a SRAM circuit and a DRAM circuit.

30. The semiconductor device according to claim 4, further comprising a main body, a camera section, an image receiving section, a manipulation switch and a display device operationally connected to constitute a TV camera, wherein said display device comprises said n-channel semiconductor device and said p-channel semiconductor device.

31. The semiconductor device according to claim 4, further comprising a main body, two display devices and a band section operationally connected to constitute a head-mounted display, wherein each of said display devices comprises said n-channel semiconductor device and said p-channel semiconductor device.

32. The semiconductor device according to claim 4, further comprising a main body, a display device, manipulation switches and an antenna operationally connected to constitute a car navigation apparatus, wherein said display device comprises said n-channel semiconductor device and said p-channel semiconductor device.

33. The semiconductor device according to claim 4, further comprising a main body, a voice output section, a voice input section, a display device, manipulation buttons and an antenna operationally connected to constitute a cellular telephone, wherein said display device comprises said n-channel semiconductor device and said p-channel semiconductor device.

34. The semiconductor device according to claim 4, further comprising a main body, a display device, a voice input section, manipulation switches, a battery and an image receiving section operationally connected to constitute a video camera, wherein said display device comprises said n-channel semiconductor device and said p-channel semiconductor device.

35. The semiconductor device according to claim 4, further comprising a main body, a light source, a reflection-type display device, an optical system and a screen operationally connected to constitute a front projection apparatus, wherein the reflection-type display device comprises the n-channel semiconductor device and said p-channel semiconductor device.

36. The semiconductor device according to claim 4, wherein the semiconductor device is an integrated circuit selected from a SRAM circuit and a DRAM circuit.

37. The semiconductor device according to claim 5, further comprising a main body, a camera section, an image receiving section, a manipulation switch and a display device operationally connected to constitute a TV camera, wherein said display device comprises said n-channel semiconductor device and said p-channel semiconductor device.

38. The semiconductor device according to claim 5, further comprising a main body, two display devices and a band section operationally connected to constitute a head-mounted display, wherein each of said display devices comprises said n-channel semiconductor device and said p-channel semiconductor device.

39. The semiconductor device according to claim 5, further comprising a main body, a display device, manipulation switches and an antenna operationally connected to constitute a car navigation apparatus, wherein said display device comprises said n-channel semiconductor device and said p-channel semiconductor device.

40. The semiconductor device according to claim 5, further comprising a main body, a voice output section, a voice input section, a display device, manipulation buttons and an antenna operationally connected to constitute a cellular telephone, wherein said display device comprises said n-channel semiconductor device and said p-channel semiconductor device.

41. The semiconductor device according to claim 5, further comprising a main body, a display device, a voice input section, manipulation switches, a battery and an image receiving section operationally connected to constitute a video camera, wherein said display device comprises said n-channel semiconductor device and said p-channel semiconductor device.

42. The semiconductor device according to claim 5, further comprising a main body, a light source, a reflection-type display device, an optical system and a screen operationally connected to constitute a front projection apparatus, wherein the reflection-type display device comprises the n-channel semiconductor device and said p-channel semiconductor device.

43. The semiconductor device according to claim 5, wherein the semiconductor device is an integrated circuit selected from a SRAM circuit and a DRAM circuit.

44. The semiconductor device according to claim 6, further comprising a main body, a camera section, an image receiving section, a manipulation switch and a display device operationally connected to constitute a TV camera, wherein said display device comprises said n-channel semiconductor device and said p-channel semiconductor device.

45. The semiconductor device according to claim 6, further comprising a main body, two display devices and a band section operationally connected to constitute a head-mounted display, wherein each of said display devices comprises said n-channel semiconductor device and said p-channel semiconductor device.

46. The semiconductor device according to claim 6, further comprising a main body, a display device, manipulation switches and an antenna operationally connected to constitute a car navigation apparatus, wherein said display device comprises said n-channel semiconductor device and said p-channel semiconductor device.

47. The semiconductor device according to claim 6, further comprising a main body, a voice output section, a voice input section, a display device, manipulation buttons and an antenna operationally connected to constitute a cellular telephone, wherein said display device comprises said n-channel semiconductor device and said p-channel semiconductor device.

48. The semiconductor device according to claim 6, further comprising a main body, a display device, a voice input section, manipulation switches, a battery and an image receiving section operationally connected to constitute a video camera, wherein said display device comprises said n-channel semiconductor device and said p-channel semiconductor device.

49. The semiconductor device according to claim 6, further comprising a main body, a light source, a reflection-type display device, an optical system and a screen operationally connected to constitute a front projection apparatus, wherein the reflection-type display device comprises the n-channel semiconductor device and said p-channel semiconductor device.

50. The semiconductor device according to claim 6, wherein the semiconductor device is an integrated circuit selected from a SRAM circuit and a DRAM circuit.

51. The semiconductor device according to claim 7, further comprising a main body, a camera section, an image receiving section, a manipulation switch and a display device operationally connected to constitute a TV camera, wherein said display device comprises said n-channel semiconductor device and said p-channel semiconductor device.

52. The semiconductor device according to claim 7, further comprising a main body, two display devices and a band section operationally connected to constitute a head-mounted display, wherein each of said display devices comprises said n-channel semiconductor device and said p-channel semiconductor device.

53. The semiconductor device according to claim 7, further comprising a main body, a display device, manipulation switches and an antenna operationally connected to constitute a car navigation apparatus, wherein said display device comprises said n-channel semiconductor device and said p-channel semiconductor device.

54. The semiconductor device according to claim 7, further comprising a main body, a voice output section, a voice input section, a display device, manipulation buttons and an antenna operationally connected to constitute a cellular telephone, wherein said display device comprises said n-channel semiconductor device and said p-channel semiconductor device.

55. The semiconductor device according to claim 7, further comprising a main body, a display device, a voice input section, manipulation switches, a battery and an image receiving section operationally connected to constitute a video camera, wherein said display device comprises said n-channel semiconductor device and said p-channel semiconductor device.

56. The semiconductor device according to claim 7, further comprising a main body, a light source, a reflection-type display device, an optical system and a screen operationally connected to constitute a front projection apparatus, wherein the reflection-type display device comprises the n-channel semiconductor device and said p-channel semiconductor device.

57. The semiconductor device according to claim 7, wherein the semiconductor device is an integrated circuit selected from a SRAM circuit and a DRAM circuit.

58. The semiconductor device according to claim 12, further comprising a main body, a camera section, an image receiving section, a manipulation switch and a display device operationally connected to constitute a TV camera, wherein the display device comprises the n-type transistor and the p-channel transistor.

59. The semiconductor device according to claim 12, further comprising a main body, two display devices and a band section operationally connected to constitute a head-mounted display, wherein each of the display devices comprises the n-channel transistor and the p-channel transistor.

60. The semiconductor device according to claim 12, further comprising a main body, a display device, manipulation switches and an antenna operationally connected to constitute a car navigation apparatus, wherein the display device comprises the n-channel transistor and the p-channel transistor.

61. The semiconductor device according to claim 12, further comprising a main body, a voice output section, a voice input section, a display device, manipulation buttons and an antenna operationally connected to constitute a cellular telephone, wherein the display device comprises the n-channel transistor and the p-channel transistor.

62. The semiconductor device according to claim 12, further comprising a main body, a display device, a voice input section, manipulation switches, a battery and an image receiving section operationally connected to constitute a video camera, wherein the display device comprises the n-channel transistor and the p-channel transistor.

63. The semiconductor device according to claim 12, further comprising a main body, a light source, a reflection-type display device, an optical system and a screen operationally connected to constitute a front projection apparatus, wherein the reflection-type display device comprises the n-channel transistor and the p-channel transistor.

64. The semiconductor device according to claim 12, wherein the semiconductor device is an integrated circuit selected from a SRAM circuit and a DRAM circuit.

65. The semiconductor device according to claim 1, wherein said device is used in an EL display device.

66. The semiconductor device according to claim 4, wherein said device is used in an EL display device.

67. The semiconductor device according to claim 5, wherein said device is used in an EL display device.

68. The semiconductor device according to claim 12, wherein said device is used in an EL display device.

69. A semiconductor device comprising:
an n-type transistor comprising a source region, a drain region, a channel forming region and a low-concentration impurity region,
wherein said channel forming region has a channel length of 0.01–2 $\mu$m and comprises impurity regions, each of said impurity regions extending along a direction of said channel length, and intervals between each of said impurity regions being 30–1000 Å.

70. The semiconductor device according to claim 69, wherein said impurity regions comprise an impurity selected from oxygen, nitrogen, carbon and boron.

71. The semiconductor device according to claim 69, wherein said device is used in an EL display device.

72. A semiconductor device comprising:
an n-type transistor comprising a first channel forming region having a first channel length; and
a p-type transistor comprising a second channel forming region having a second channel length,
wherein said first channel forming region comprises first impurity regions, each of said first impurity regions extending along a direction of said first channel length, wherein said second channel forming region comprises second impurity regions, each of said second impurity regions extending along a direction of said second channel length, and intervals between each of said second impurity regions being wider than intervals between each of said first impurity regions.

73. The semiconductor device according to claim 72, wherein said first impurity regions comprise an impurity selected from oxygen, nitrogen, carbon and boron, and wherein said second impurity regions comprise an impurity selected from oxygen, nitrogen, carbon and phosphorus.

74. The semiconductor device according to claim 72, wherein said device is used in an EL display device.

75. The semiconductor device according to claim 2, wherein said device is used in an EL display device.

76. The semiconductor device according to claim 6, wherein said device is used in an EL display device.

77. The semiconductor device according to claim 7, wherein said device is used in an EL display device.

* * * * *